US007755191B2

(12) United States Patent
Furuya

(10) Patent No.: US 7,755,191 B2
(45) Date of Patent: Jul. 13, 2010

(54) SEMICONDUCTOR DEVICE AND METHOD OF MANUFACTURING THE SAME

(75) Inventor: Akira Furuya, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 77 days.

(21) Appl. No.: 11/723,498

(22) Filed: Mar. 20, 2007

(65) Prior Publication Data
US 2007/0222078 A1 Sep. 27, 2007

(30) Foreign Application Priority Data
Mar. 23, 2006 (JP) ............... 2006-081084

(51) Int. Cl.
H01L 23/48 (2006.01)
H01L 23/52 (2006.01)
(52) U.S. Cl. ................ 257/751; 257/754; 257/757; 438/627
(58) Field of Classification Search ........ 257/751, 257/754, 757, E21.575–E21.597, E21.627; 438/627
See application file for complete search history.

(56) References Cited
U.S. PATENT DOCUMENTS

| 6,693,356 | B2 | | 2/2004 | Jiang et al. | |
| 6,906,420 | B2 | * | 6/2005 | Harada | 257/754 |
| 6,921,712 | B2 | * | 7/2005 | Soininen et al. | 438/597 |
| 2005/0263902 | A1 | * | 12/2005 | Lin et al. | 257/762 |
| 2006/0261483 | A1 | * | 11/2006 | Tsumura et al. | 257/758 |
| 2007/0273042 | A1 | * | 11/2007 | Kuhn et al. | 257/762 |

FOREIGN PATENT DOCUMENTS

| JP | 11-040671 | 12/1999 |
| JP | 2000-294634 | 10/2000 |
| WO | 2004-107434 | 12/2004 |

OTHER PUBLICATIONS

Low Resistive and Highly Reliable Cu Dual-Damascene Interconnect Technology Using Self-Formed $MnSi_xO_y$ Barrier Layer, T. Usui et al., Semiconductor Technology Academic Research Center, Jun. 6-8, 2005, pp. 1-4.
Notication of First Office Action, dated Oct. 10, 2008, NEC Electronics Corporation, Application No. 200710089394.2.

* cited by examiner

Primary Examiner—Theresa T Doan
(74) Attorney, Agent, or Firm—Young & Thompson

(57) ABSTRACT

A semiconductor device includes a first copper-containing conductive film formed on a substrate, insulating films formed on the first copper-containing conductive film with a concave portion reaching the first copper-containing conductive film, a second barrier insulating film formed to cover the side wall of the concave portion of these insulating films, a second adhesive alloy film made of copper and a dissimilar element other than copper, and coming in contact with the first copper-containing conductive film at the bottom surface of the concave portion and in contact with the second barrier insulating film at the side wall of the concave portion to cover the inside wall of the concave portion, and a second copper-containing conductive film containing copper as a main component, and formed on the second adhesive alloy film in contact with the second adhesive alloy film to fill the concave portion.

14 Claims, 5 Drawing Sheets

FIG. 5

| METAL OXIDE | FORMATION ENTHALPY PER METAL MOL (kJ/mol) |
|---|---|
| CuO | −157 |
| $Al_2O_3$ | −837 |
| $Co_3O_4$ | −685 |
| $Cr_3O_4$ | −510 |
| $HfO_2$ | −1144 |
| MgO | −601 |
| $MnO_2$ | −520 |
| $MoO_3$ | −745 |
| $TiO_2$ | −944 |
| $WO_3$ | −843 |
| $RuO_2$ | −305 |
| $Ta_2O_5$ | −1023 |
| $Nb_2O_5$ | −949 |
| $ZrO_2$ | −1100 |
| $SiO_2$ | −910 |

SEMICONDUCTOR DEVICE AND METHOD OF MANUFACTURING THE SAME

This application is based on Japanese patent application No. 2006-081,084, the content of which is incorporated hereinto by reference.

BACKGROUND

1. Technical Field

The present invention relates to a semiconductor device and a method of manufacturing the same, and in particular to a semiconductor device having a multilayer interconnection structure and a method of manufacturing the same.

2. Related Art

Devices and interconnect lines in semiconductor integrated circuits have been scaled down for the purpose of improving the characteristics and reducing the cost per function. The electrical specifications of devices such as transistors are improved by scaling (down) and other several solutions. On the other hand, because of the scaling (down) of interconnect lines, a remarkable increase occurs in the line resistance and the inter-line capacitance. The delay constant of signal propagation along interconnect line is represented by the product of the line resistance and the inter-line capacitance. In recent semiconductor integrated circuits, the delay of signal propagation along interconnect lines has become a bottleneck limiting the circuit operation speed because of the increase in the line resistance and the inter-line capacitance due to the scaling down of interconnect lines. Under such situation, a low dielectric constant material having a smaller relative dielectric constant than a conventional silicon dioxide ($SiO_2$) film is used as the interlayer insulating film and copper (Cu) having a small electrical resistivity are used as the interconnect lines respectively, in order to improve the circuit operation speed.

The multilayer interconnection, which is made of copper as a wiring material, is formed by a damascene process as described below. At first, concave portions such interconnection grooves and via holes are formed in an interlayer insulating film, and a barrier metal film is deposited in the concave portions for improving the contact property between a copper film and the interlayer insulating film and for preventing copper from being diffused. Then, after filling the concave portions with a copper film, copper interconnect lines or copper vias are formed by removing the copper film and barrier metal film exposed outside of the concave portions by CMP (chemical mechanical polishing).

For such copper interconnect lines or copper vias, the barrier metal is made for example of a TiN film, a W (tungsten) based film or the like. The electrical resistivity of the barrier metal is one, two or more orders of magnitude higher than that of copper. Because of this, there is a problem that the contribution of the barrier metal film to the formation of the interconnect lines increases as the wiring dimensions decrease, and thereby the line resistance increases.

Copper interconnection structures without using a barrier metal film have also been considered. Japanese Laid-open patent publication No. H11-40671 discloses a method of manufacturing semiconductor devices comprising a step of converting a part of a patterned insulating layer into a barrier film, a step of covering the barrier film with an adhesive layer, and a step of forming a film containing a conductive metal on the adhesive layer. The barrier film is a silicon oxynitride film which is formed by performing a plasma nitriding step on an insulating layer which is an oxide film made of a low dielectric constant material. The adhesive layer contains silicon, silicon germanium, germanium or the like. Also, the adhesive layer can contain magnesium, titanium or the like.

T. Usui et. al ("Low Resistive and Highly Reliable Cu Dual-Damascene Interconnect Technology Using Self-Formed $MnSi_xO_y$ Barrier Layer"; Proceedings of the IEEE 2005 International Interconnect Technology Conference (IEEE Cat. No. 05TH8780C); IEEE, Piscataway, N.J., USA, 2005, 242 Pages; 6-8 June 2005; Page 188-90) discloses the technique of forming a Cu—Mn film in a concave portion of an insulating film made of TEOS—$SiO_2$, and using this film as a seed film, forming copper by plating. After forming a copper film, an $MnSi_xO_y$ barrier layer is formed by annealing to have the Cu—Mn film react with TEOS—$SiO_2$.

SUMMARY OF THE INVENTION

However, according to Japanese Laid-open patent publication No. H11-40671, silicon or other metal is concentrated at high density at the crystal grain boundary of copper at the boundary between the copper film and the adhesive layer or the vicinity thereof, and thereby there is a problem that the wiring resistance increases and the interconnect resistance cannot be reduced.

Also, in the case of the technique described by T. Usui et. al, the film thickness of the Cu—Mn film has to be increased in order to reliably form a barrier insulating film. This may cause a problem that the line resistance increases as the Mn density in the copper interconnect increases. In addition to this, high temperature annealing is needed to diffuse Mn in the surface of the copper film so that the manufacturing stability of semiconductor devices is deteriorated, and the processing time increases. Furthermore, if a low dielectric constant porous film is used in place of TEOS—$SiO_2$, the density of the barrier insulating film becomes low as it reflects the porous structure, and may cause a problem of decreasing the barrier ability and the adhesion ability.

According to the present invention, there is provided a semiconductor device comprising: a lower layer conductive film formed on a substrate; an interlayer insulating film formed on said lower layer conductive film and provided with a concave portion which reaches said lower layer conductive film; a barrier insulating film formed to cover the side wall of said concave portion of said interlayer insulating film, and made of a material capable of preventing copper from being diffused; an alloy film made of copper and a dissimilar element other than copper, and coming in contact with said lower layer conductive film at the bottom surface of said concave portion and in contact with said barrier insulating film at the side wall of said concave portion in order to cover the inside wall of said concave portion; and an upper layer conductive film containing copper as a main component, and formed on said alloy film in contact with said alloy film to fill the concave portion.

According to the present invention, there is provided a method of manufacturing a semiconductor device comprising: forming an interlayer insulating film on a lower layer conductive film formed on a substrate; forming a concave portion in said interlayer insulating film which reaches said lower layer conductive film; forming a barrier insulating film, which is made of a material capable of preventing copper from being diffused, to cover the inside wall of said concave portion; removing a region of said barrier insulating film, which is in contact with the interlayer insulating film at the bottom of said concave portion, to expose said lower layer conductive film; forming an alloy film made of copper and a dissimilar element other than copper to cover the inside wall of said concave portion; and forming an upper layer conductive film, which contains copper as a main component in said concave portion in contact with said alloy film to fill the concave portion.

In this case, each of the lower layer conductive film and the upper layer conductive film may be an interconnect or a via containing copper as a main component respectively. According to the present invention, the barrier insulating film is provided in place of a conventional barrier metal film. Because of this, no high resistance conductive material is provided to the side of the conductive film so that it is possible to reduce the resistance of the conductive film.

On the other hand, there is a problem that the adhesion between copper and an insulating film is poor. The reason for this is considered that the surface energy of copper is not sufficiently large and that the formation enthalpy of copper and an element contained in the insulating film is high. For this reason, in the past, the adhesion of copper is improved by forming a barrier metal film between copper and an insulating film in order to form a strong metallurgical bond at the boundary between copper and the barrier metal film. According to the present invention, an alloy film of copper and a dissimilar element is provided between a barrier insulating film and a conductive film. The adhesion of the conductive film can be improved by selecting, as the dissimilar element of the alloy film, an element which can form a strong metallurgical bond with an element contained in the barrier insulating film. As the dissimilar element, for example, it is preferred to use an element having a larger surface energy than copper, an element contained in the barrier insulating film, an element selected in order that the formation enthalpy of this element and another element contained in the barrier insulating film is lower than the formation enthalpy of this another element and copper.

FIG. 4 shows the temperature dependences calculated of the surface energies of Hf, Ti, Ta, Nb, Zr and Cu (Source: "Data Book of Metals", 4th Revision, 2004, published by Maruzen, Co., Ltd.). As illustrated in the figure, each of Hf, Ti, Ta, Nb and Zr exhibits a higher surface tension than Cu at a same temperature condition.

In addition, the formation enthalpy of a metal and another element will be explained using several metal oxides as examples. FIG. 5 shows the relationship between metal oxides and the formation enthalpy per metal mol (kJ/mol) (if the formation enthalpy of $M_xO_y$ is $\Delta H$ kJ/mol, the formation enthalpy per metal mol is $\Delta H/x$ kJ/mol (Source: "CRC Handbook of Chemistry and Physics", 86th Editions, 2005-2006)). As illustrated in the figure, the formation enthalpy of CuO is significantly high as compared with those of oxides of other metals (Al, Co, Cr, Hf, Mg, Mn, Mo, Ti, W, Ru, Ta, Nb and Zr) or $SiO_2$. While oxides are compared as examples in this case, for example, nitrides exhibit similar tendencies, and the formation enthalpy of copper and another element generally tends to be higher. On the other hand, particularly, Hf, Ti, Ta, Nb, Zr or the like tends to exhibit a lower formation enthalpy in combination with another element as compared to other metals. For this reason, it is expected that the adhesion to the insulating film can be improved by making use of the alloy film of such a metal and copper. As has been discussed above, from the view points of both surface tension (surface energy) and formation enthalpy (binding energy), it is expected that the adhesion of Hf, Ti, Ta, Nb, or Zr to the insulating film can be higher than that of copper.

In addition, since the alloy film contains copper, it is possible to maintain the resistance of the alloy film low. According to the present invention, an alloy of copper and the dissimilar element is also formed at the boundary between the conductive film and the alloy film and at the boundary between the alloy film and the barrier insulating film. Because of this, the dissimilar element shall not be concentrated at the crystal grain boundary of copper so that the resistance of the alloy film can be maintained low. Furthermore, only the alloy film is interposed between the lower layer conductive film and the upper layer conductive film. It is therefore possible to reduce the resistance between the lower layer conductive film and the upper layer conductive film.

It is to be noted that any arbitrary combination of the above-described structural components and expressions changed between a method, an apparatus, and so forth are all effective as and encompassed by the present embodiments.

As a result, in accordance with the present invention, it is possible to reduce the resistance of an interconnect and improve the adhesion between the interconnect material and an interlayer insulating film.

BRIEF DESCRIPTION OF THE DRAWINGS

The above and other objects, advantages and features of the present invention will be more apparent from the following description taken in conjunction with the accompanying drawings, in which:

FIG. 5 shows the relationship between metal oxides and the formation enthalpy per metal mol (kJ/mol).

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In what follows, an embodiment of the present invention will be explained in conjunction with the accompanying drawings. Incidentally, in all of the drawings, like parts have been given like references, and redundant description will not be repeated.

Figure 1:
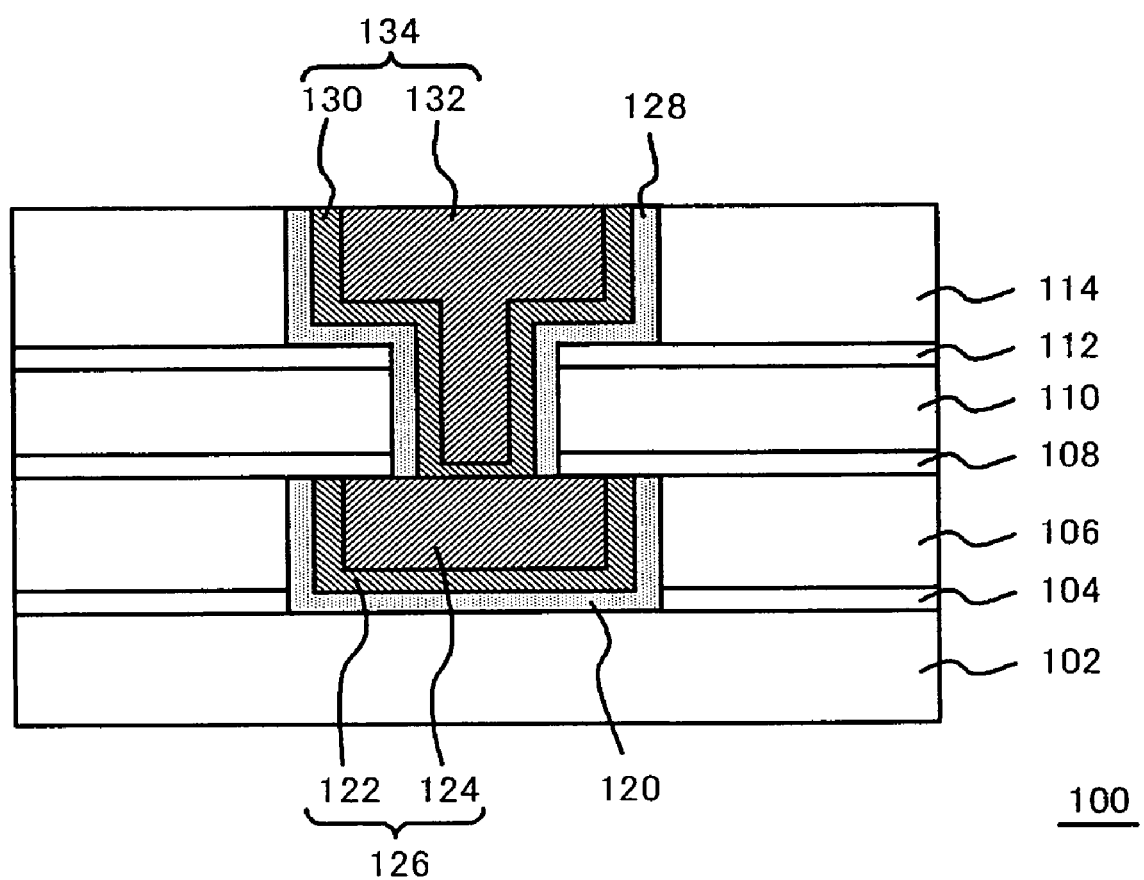
FIG. 1 is a cross-sectional view for showing the structure of a semiconductor device in accordance with an embodiment of the present invention.

FIG. 1 is a cross-sectional view for showing the structure of a semiconductor device in accordance with the present embodiment. According to the present embodiment, an interconnect is formed in a dual damascene structure.

The semiconductor device 100 includes a semiconductor substrate (not shown) on which transistors or the like devices are formed, a first interlayer insulating film 102 formed on the semiconductor substrate, a first etching stopper film 104, a second interlayer insulating film 106, a first cap insulating film 108, a third interlayer insulating film 110, a second etching stopper film 112, and a fourth interlayer insulating film 114.

The semiconductor device 100 includes a first barrier insulating film 120 and a lower layer interconnect (or lower layer conductive film) 126 which are formed in the first etching stopper film 104 and the second interlayer insulating film 106, and a second barrier insulating film 128 and an upper layer interconnect 134 which are formed in the first cap insulating film 108, the third interlayer insulating film 110, the second etching stopper film 112 and the fourth interlayer insulating film 114. The lower layer interconnect 126 is composed of a first adhesive alloy film 122 and a first copper-containing conductive film 124. The upper layer interconnect 134 is composed of a second adhesive alloy film 130 (or alloy film) and a second copper-containing conductive film 132. The first copper-containing conductive film 124 and the second copper-containing conductive film 132 may contain traces of some metal such as Al, Ag or the like in addition to copper, but is made of a material containing copper as a main component. According to the present embodiment, the first copper-containing conductive film 124 and the second copper-containing conductive film 132 may be copper films.

The first barrier insulating film 120 and the second barrier insulating film 128 are formed of a material which is effective to prevent copper from being diffused. The first barrier insulating film 120 and the second barrier insulating film 128 are formed of a material which substantially contains no oxygen. By this configuration, it is possible to improve the adhesion between the alloy film and the barrier insulating film. Particularly, in the case where the insulating film contains oxygen, there is the problem of the poor adhesion between the insulating film and the copper film. The reason for this is considered that the copper film is oxidized by oxygen in the insulating film. However, since the barrier insulating film of the present embodiment substantially does not contain oxygen, the adhesion can be maintained better even in the case where copper is contained in the alloy film at the boundary surface. In addition, it is possible to improve the diffusion blocking function of the barrier insulating film by preventing the adhesion from being degraded. Furthermore, since the barrier insulating film of the present embodiment substantially contains no oxygen, it is possible to prevent the alloy film from being oxidized. By this configuration, as has been discussed above, it is possible to maintain the adhesion and decrease the resistance of the interconnect. In addition to this, the wiring capacity can be maintained as has been designed. The first barrier insulating film 120 and the second barrier insulating film 128 may be formed, for example, of an SiN film (silicon nitride film) or an SiCN film.

According to the present embodiment, each of the first adhesive alloy film 122 and the second adhesive alloy film 130 is formed of an alloy film which is composed of copper and a dissimilar element other than copper. In this case, the content of the dissimilar element in the adhesive alloy film may, for example, be greater than or equal to 0.1 wt % as the ratio of the dissimilar element to the material of the adhesive alloy film. Also, the content of the dissimilar element in the adhesive alloy film may, for example, be less than or equal to 30 wt % as the ratio of the dissimilar element to the material of the adhesive alloy film. The first adhesive alloy film 122 is provided between the first barrier insulating film 120 and the first copper-containing conductive film 124 in contact with these films. Since the first adhesive alloy film 122 contains copper, it shows a better adhesion to the first copper-containing conductive film 124. Likewise, the second adhesive alloy film 130 is provided between the second barrier insulating film 128 and the second copper-containing conductive film 132 in contact with these films. Since the second adhesive alloy film 130 contains copper, it shows a better adhesion to the second copper-containing conductive film 132. Also, the first barrier insulating film 120 and the second barrier insulating film 128 may be formed respectively of a material providing a better adhesion to the first barrier insulating film 120 and the second barrier insulating film 128.

In what follows, the formation of the second adhesive alloy film 130 will be explained as an example. The first adhesive alloy film 122 may have a same structure as the second adhesive alloy film 130. The second adhesive alloy film 130 composed of copper and the dissimilar element may have a composition which is substantially uniform from the boundary with the second copper-containing conductive film 132 to the boundary with the second barrier insulating film 128. It means that the second adhesive alloy film 130 is formed to have a substantial uniform composition rate of the copper and the dissimilar element from the boundary with the second copper-containing conductive film 132 to the boundary with the second barrier insulating film 128. According to the present embodiment, the second adhesive alloy film 130 contains copper having a low electrical resistivity, and is composed of an alloy of copper and the dissimilar element. By this configuration, it is possible to decrease the resistance of the second adhesive alloy film 130. The second adhesive alloy film 130 may be formed of a compound of copper and a dissimilar element. By this configuration, it is possible to further decrease the resistance of the second adhesive alloy film 130.

The other element contained in the second adhesive alloy film 130 may be at least one element which is also contained in the second barrier insulating film 128. For example, in the case where Si is contained in the second barrier insulating film 128, Si may be used as the dissimilar element. The second adhesive alloy film 130 may be formed of a copper silicide layer.

In addition, the dissimilar element contained in the second adhesive alloy film 130 is at least one metal selected from among Hf, Ta, Ti, Nb and Zr. These kinds of metallic elements have larger surface tensions than copper so that the adhesion to the insulating film can be improved in comparison with the adhesion of a film containing copper as a major component to the insulating film.

The first barrier insulating film 120 is formed to cover the side wall of the concave portion formed in the first etching stopper film 104 and the second interlayer insulating film 106. The first adhesive alloy film 122 is formed in contact with the first barrier insulating film 120 to cover the inside wall of the concave portion formed in the first etching stopper film 104 and the second interlayer insulating film 106. The first copper-containing conductive film 124 is formed on the first adhesive alloy film 122 in contact with the first adhesive alloy film 122 to fill the concave portion.

The second barrier insulating film 128 is formed to cover the side wall of the concave portion formed in the first cap insulating film 108, the third interlayer insulating film 110 and the second etching stopper film 112. The second adhesive alloy film 130 is formed in contact with the first copper-containing conductive film 124 at the bottom surface of the concave portion and in contact with the second barrier insulating film 128 at the side wall of the concave portion to cover the inside wall of the concave portion. The second copper-containing conductive film 132 is formed on the second adhesive alloy film 130 in contact with the second adhesive alloy film 130 to fill the concave portion.

Meanwhile, in this case, the first barrier insulating film 120 is formed on the entire bottom surface of the concave portion. However, in the case where the lower layer interconnect 126 is connected to a further lower layer interconnect located below the lower layer interconnect 126, the first barrier insulating film 120 is not formed in the connection area in the same manner as the second barrier insulating film 128.

Next, the procedure of manufacturing the semiconductor device 100 will be explained. FIGS. 2A to 2C and FIGS. 3A to 3C are cross-sectional views for showing the steps of the procedure of manufacturing the semiconductor device 100 in accordance with the present embodiment.

In this case, the procedure is explained from the state in which the lower layer interconnect 126 is formed. After forming the lower layer interconnect 126, the first cap insulating film 108, the third interlayer insulating film 110, the second etching stopper film 112 and the fourth interlayer insulating film 114 are formed in this order on the lower layer interconnect 126.

The third interlayer insulating film 110 and the fourth interlayer insulating film 114 may be formed of a material containing Si and O. According to the present embodiment, the third interlayer insulating film 110 and the fourth interlayer insulating film 114 may be formed of a low dielectric constant film. More specifically, the third interlayer insulating film 110 and the fourth interlayer insulating film 114 may be formed, for example, of SiOC. The second interlayer insulating film 106 can be formed of the same material as the third interlayer insulating film 110 and the like. The first interlayer insulating film 102 may be formed, for example, of $SiO_2$.

The second etching stopper film 112 can be formed, for example, of SiC, SiCN, SiOC or SiON. Also, the first etching stopper film 104 can be formed of the same material as the second etching stopper film 112. The first cap insulating film 108 can be formed, for example, of SiCN.

Figure 2A:
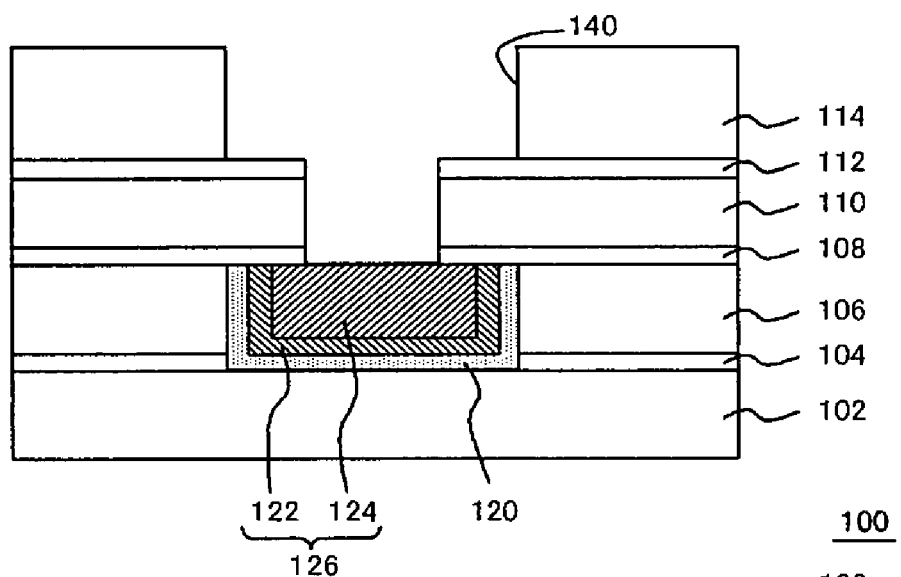
FIGS. 2A to 2C and FIGS. 3A to 3C are cross-sectional views for showing the steps of the procedure of manufacturing the semiconductor device in accordance with the embodiment of the present invention.

Then, a dual damascene interconnect groove 140 is formed to reach the first copper-containing conductive film 124 by etching the fourth interlayer insulating film 114, the second etching stopper film 112, the third interlayer insulating film 110 and the first cap insulating film 108. By this configuration, the surface of the first copper-containing conductive film 124 is exposed at the bottom of the dual damascene interconnect groove 140 (FIG. 2A).

Figure 2B:
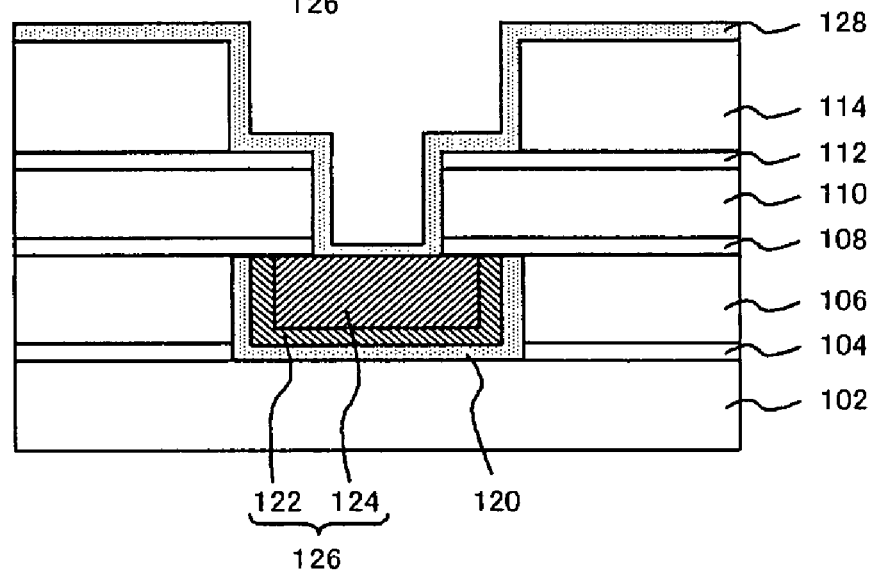

Next, the second barrier insulating film 128 is formed to cover the inside wall of the dual damascene interconnect groove 140 (FIG. 2B). The second barrier insulating film 128 can be formed by a CVD method (chemical vapor deposition method). In this case, the second barrier insulating film 128 can be formed of a SiN film. As has been discussed above, the second barrier insulating film 128 is formed by a CVD method and the like, and thereby the material of the second barrier insulating film 128 can be determined independent of the material of the third interlayer insulating film 110 and the fourth interlayer insulating film 114. By this configuration, for example, even in the case where the third interlayer insulating film 110 and the fourth interlayer insulating film 114 contain oxygen, the second barrier insulating film 128 can be formed to contain substantially no oxygen. By this configuration, as described above, it is possible to improve the adhesion to the second adhesive alloy film 130 and prevent the second adhesive alloy film 130 from being oxidized.

Figure 2C:
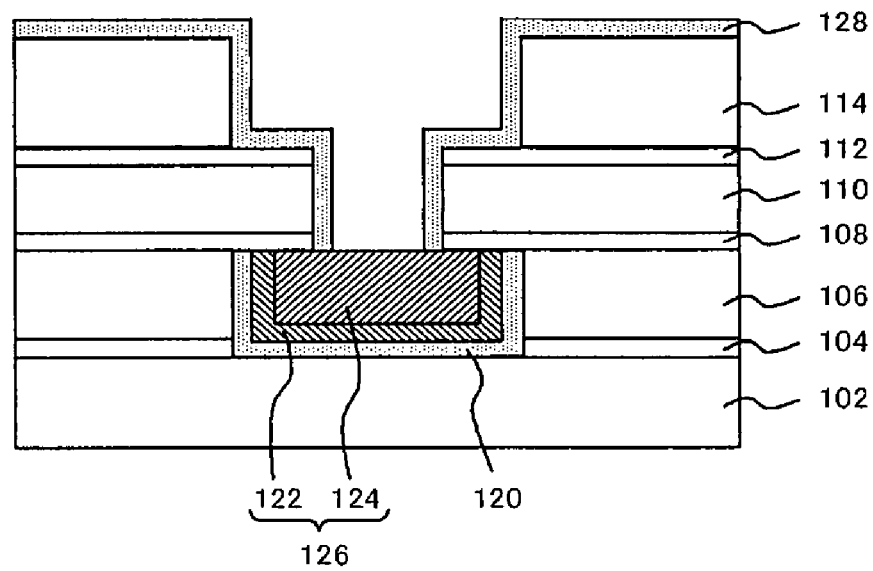

Thereafter, the first copper-containing conductive film 124 is exposed by selectively removing the region of the second barrier insulating film 128 (having a thickness of 1 to 20 nm or thereabout) contacting with the first copper-containing conductive film 124 at the bottom of the dual damascene interconnect groove 140 (FIG. 2C). As illustrated in FIG. 2B, when the second barrier insulating film 128 is formed by CVD method in the dual damascene interconnect groove 140, the thickness of the second barrier insulating film 128 at the region contacting with the first copper-containing conductive film 124 at the bottom of the dual damascene interconnect groove 140 is smaller than the thickness of the other region. Because of this, in accordance with the present embodiment, it is possible to selectively remove the region of the second barrier insulating film 128 at the bottom of the dual damascene interconnect groove 140 by performing a dry etching process all over the second barrier insulating film 128.

Figure 3A:
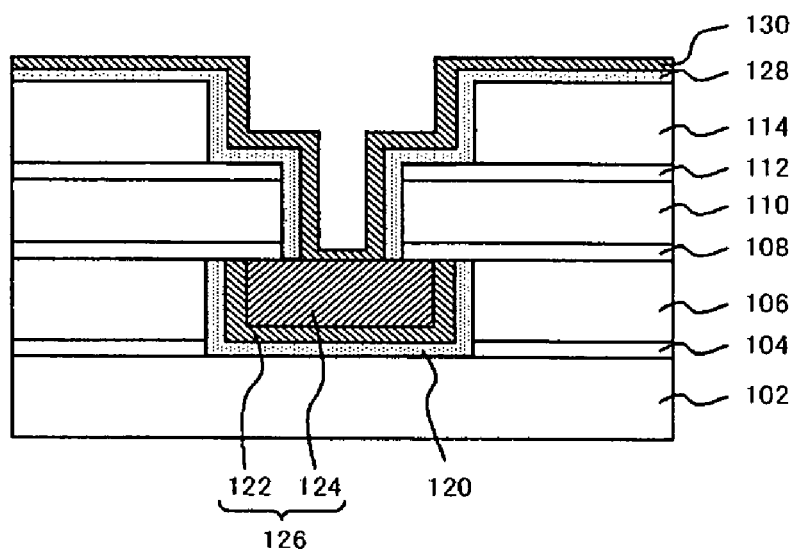

Thereafter, the second adhesive alloy film 130 (having a thickness of 1 to 20 nm or thereabout) is formed to cover the inside wall of the dual damascene interconnect groove 140 (FIG. 3A). In the case where the dissimilar element is Si, the second adhesive alloy film 130 may be formed by ALD (Atomic Layer Deposition) using a raw material containing copper and a raw material containing Si. Alternatively, the second adhesive alloy film 130 may be formed by firstly forming a copper film by sputtering or ALD and then irradiating the copper film with a gas cluster ion beam of molecular cluster ions containing Si. Furthermore, it is possible to form the second adhesive alloy film 130 by a sputtering process with using an alloy of copper and the dissimilar element as a target.

Figure 3B:
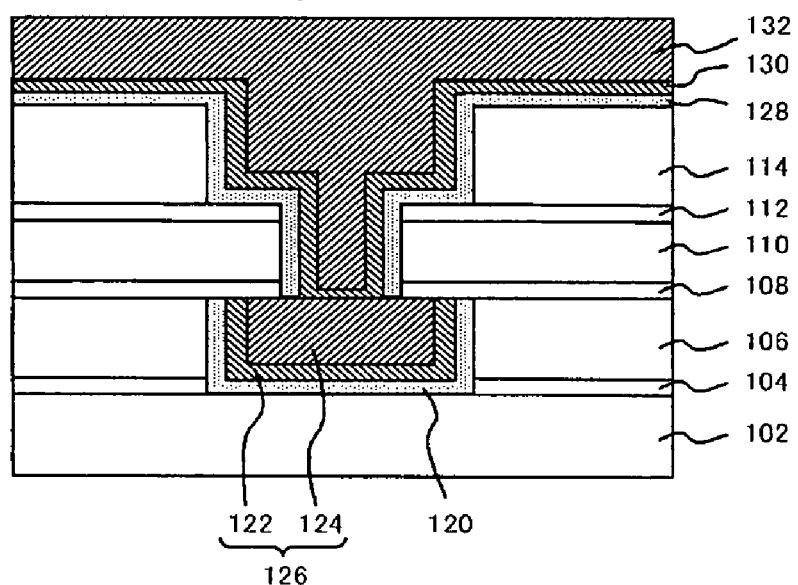

Next, the second copper-containing conductive film 132 is formed in contact with the second adhesive alloy film 130 to fill the dual damascene interconnect groove 140 (FIG. 3B). The method of manufacturing the second copper-containing conductive film 132 is not particularly limited, but may be formed, for example, by electroless plating, electrolytic plating, CVD, ALD, supercritical fluid reaction and so forth. When the second copper-containing conductive film 132 is formed by electrolytic plating, the second adhesive alloy film 130 can be used as a seed film. Because of this, it is possible to dispense with the step of forming a seed film. However, for example, if the film thickness of the second adhesive alloy film 130 is small, the second copper-containing conductive film 132 may be formed by forming a seed film containing copper on the second adhesive alloy film 130, and performing a plating method by the use of this seed film.

Thereafter, CMP is performed to remove the second copper-containing conductive film 132, the second adhesive alloy film 130 and the second barrier insulating film 128, which are exposed outside of the dual damascene interconnect groove 140. By this process, the semiconductor device 100 is formed as illustrated in FIG. 1.

Figure 3C:
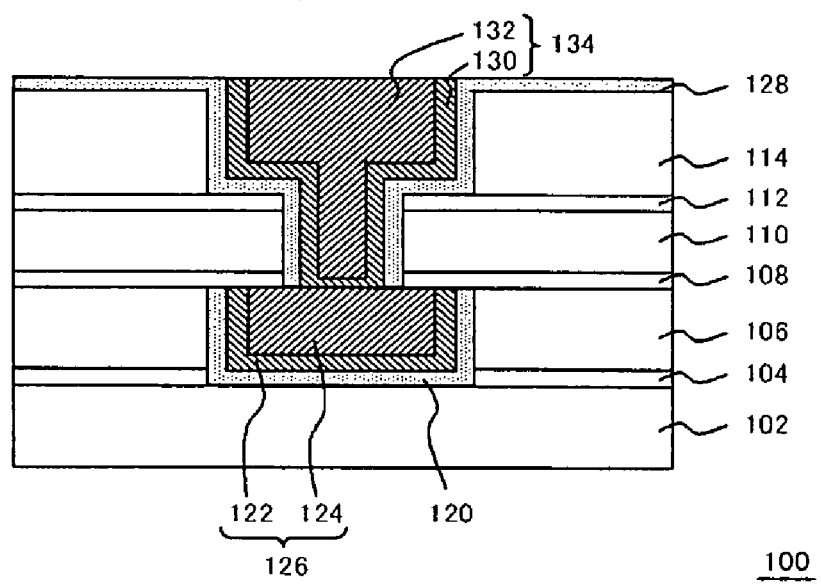
Figure 4:
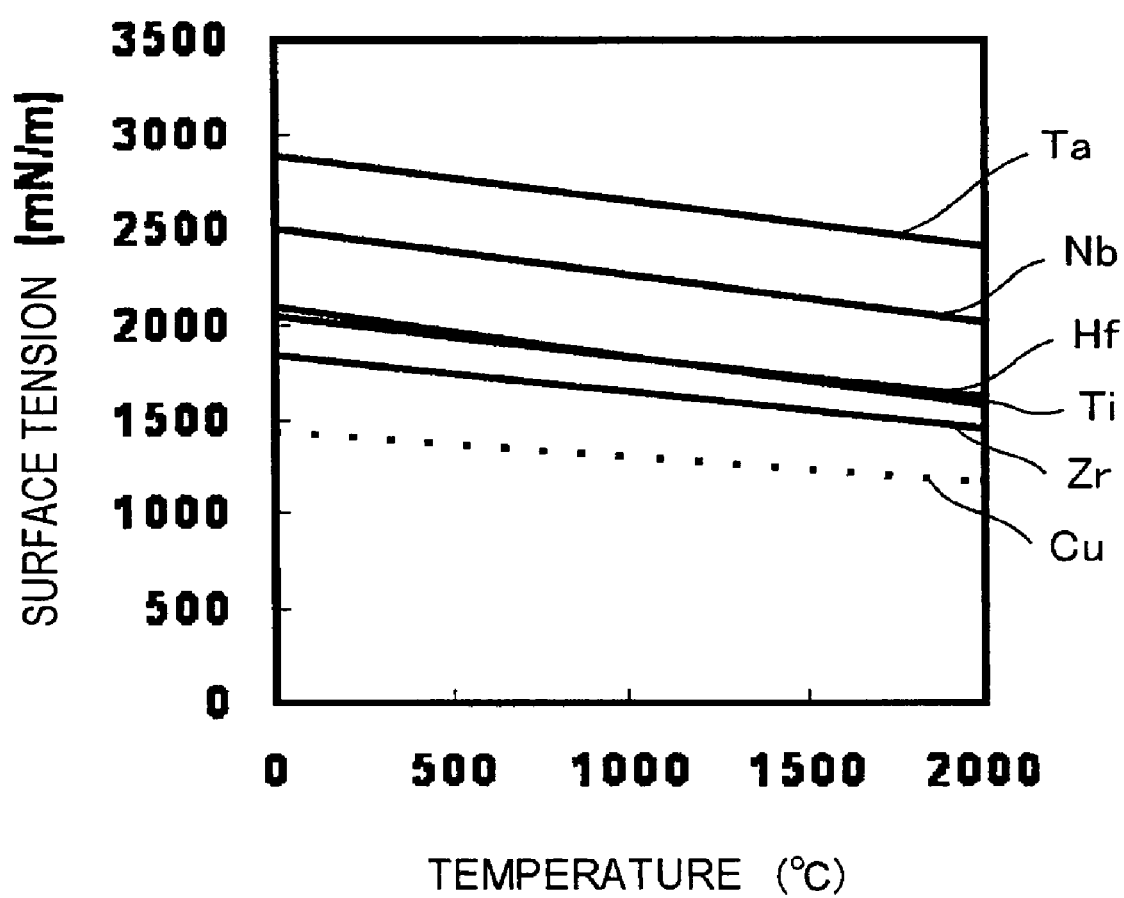
FIG. 4 shows the temperature dependences calculated of the surface energies of Hf, Ti, Ta, Nb, Zr and Cu.

Alternatively, as illustrated in FIG. 3C, it is possible to leave the second barrier insulating film 128 at the outside of the dual damascene interconnect groove 140 without removing it and the upper layers may be formed. By this configuration, it is possible to make effective use of the second barrier insulating film 128 as a protection film for protecting the fourth interlayer insulating film 114 during CMP.

When an interconnect is formed with a barrier metal film such as a TiN film, a W based film or the like, as is conventional, the step of removing the copper-containing conductive film by CMP is followed by removing the barrier metal film exposed outside of the interconnect groove. In this case, since different polishing agents for CMP are used between the copper-containing conductive film and the barrier metal film, separate CMP steps have to be performed. However, in accordance with the present embodiment, the interconnect is formed with no barrier metal film. The first adhesive alloy film 122 is formed of a material containing copper in the same manner as the first copper-containing conductive film 124. Because of this, the first copper-containing conductive film 124 and the first adhesive alloy film 122 can be removed at the same time by CMP to simplify the process.

Furthermore, since the standard electrode potential of the conventional barrier metal film is higher than that of the copper-containing conductive film, the differential standard electrode potential between the copper-containing conductive film and the barrier metal film causes a local cell action when the conventional barrier metal film is exposed to a CMP polishing agent while the copper-containing conductive film and the conventional barrier metal film are in contact with each other. Because of this, a current flows between the copper-containing conductive film and the barrier metal film, and thereby galvanic corrosion occurs in the barrier metal film. However, in the case of the present embodiment, no barrier metal film is provided for the interconnect. Since the standard electrode potential of the dissimilar element contained in the first adhesive alloy film 122 is lower than that of copper, the adhesive alloy film 122 has a lower standard electrode potential than the first copper-containing conductive film 124 which contains copper as a major component. It is therefore possible to prevent galvanic corrosion which is often problematic when a barrier metal film is used.

In addition, since the first adhesive alloy film 122 contains copper, the standard electrode potential of the first adhesive alloy film 122 becomes close to that of the first copper-containing conductive film 124. Because of this, when the first copper-containing conductive film 124 is formed by plating, it is possible to make use of the first adhesive alloy film 122 as a seed film, dispense with another seed film, and further simplify the process.

According to the present embodiment, as has been discussed above, since there is the adhesive alloy film between the barrier insulating film and the copper-containing conductive film, the adhesion between the barrier insulating film and the copper-containing conductive film can be improved. The first copper-containing conductive film 124 and the second copper-containing conductive film 132 are electrically connected to each other through the second adhesive alloy film 130. Since the second adhesive alloy film 130 is composed of copper and the dissimilar element, the resistance of the second adhesive alloy film 130 can be decreased as compared with conventional barrier metal films. By this configuration, it is possible to reduce the wiring resistance.

Also, if a high resistance conductive film such as a conventional barrier metal film is formed on the side surface of the second copper-containing conductive film 132, the resistance of an interconnect increases and in addition the wiring capacity decreases. Particularly, when the dimension of the semiconductor device decreases, the percent of the interconnect made up by the barrier metal film increases, and the above problem becomes marked. According to the present embodiment, in place of the conventional barrier metal film, the second adhesive alloy film 130 is formed also on the side surface of the second copper-containing conductive film 132. Because of this, it is possible to decrease the resistance of the interconnect and prevent the wiring capacity from decreasing.

In addition, according to the present embodiment, the barrier insulating film is formed on the second copper-containing conductive film 132 through the second adhesive alloy film 130 in the area where the second copper-containing conductive film 132 adjoins the interlayer insulating film. The barrier insulating film serves to provide a diffusion blocking function for preventing copper contained in the second copper-containing conductive film 132 from being diffused into the interlayer insulating film. Since the second adhesive alloy film 130 needs not to provide such a diffusion blocking function, the film thickness of the second adhesive alloy film 130 can be reduced. By this configuration, it is possible to further decrease the wiring resistance.

Furthermore, according to the present embodiment, the alloy film contains copper having a low electrical resistivity, and is composed of an alloy of copper and the dissimilar element. The alloy film composed of copper and the dissimilar element is formed to have a composition which is substantially uniform from the boundary with the copper-containing conductive film to the boundary with the barrier insulating film. By this configuration, it is possible to decrease the resistance of the alloy film. As described above, in the case where copper is contained also in the boundary between the alloy film and the barrier insulating film, the resistance of the alloy film can be decreased.

In addition, the barrier insulating film is formed of a material which does substantially not contain oxygen. By this configuration, it is possible to improve the adhesion between the barrier insulating film and the alloy film, improve the diffusion blocking function, and prevent the alloy film and the copper-containing conductive film from being oxidized. In accordance with the semiconductor device 100 of the present embodiment, since the alloy film is formed between the barrier insulating film and the copper-containing conductive film containing copper as a main component, and the barrier insulating film does substantially not contain oxygen, it is possible to prevent the alloy film from being oxidized and improve the adhesion between the alloy film and the barrier insulating film.

Example

The adhesion between copper films and insulating films was examined. In this case, an $SiO_2$ film and a barrier metal film made of a TaN film and a Ta film were formed on a Si substrate in this order, followed by depositing a Cu film. Then, an insulating film was formed on the Cu film. In this case, the insulating film was (i) an $SiO_2$ film and (ii) an SiN film. 10×10 squares are written with a diamond pen in the surface of each sample prepared as described above, and a tape test was performed. Table 1 shows the average results of the above test repeated for five times. In the case where the insulating film is an SiN film, there is no square which was rubbed off. On the other hand, in the case where the insulating film was an $SiO_2$ film, all squares were rubbed off. The reason for this is considered that the copper film was oxidized at the boundary with the insulating film to degrade the adhesion between the copper film and the insulating film.

TABLE 1

| SAMPLE | STRUCTURE | TAPE TEST RESULT (SURVIVORS/ALL) |
|---|---|---|
| (i) | $SiO_2$/Cu/Ta/TaN/$SiO_2$/Si | 0/100 |
| (ii) | SiN/Cu/Ta/TaN/$SiO_2$/Si | 100/100 |

The above embodiment is explained using, as an example, an interconnect which is formed in a dual damascene structure. In the case of a dual damascene interconnect, when a barrier insulating film is formed in a dual damascene interconnect groove, the film thickness of the barrier insulating film tends to be small at the bottom. Because of this, there is an advantage that the barrier insulating film of the interconnect groove can selectively be removed at the bottom. However, needless to say, the present invention can be also applied to a single damascene interconnect structure.

It is apparent that the present invention is not limited to the above embodiment, and may be modified and changed without departing from the scope and spirit of the invention.

What is claimed is:

1. A semiconductor device, comprising:
a lower layer conductive film formed on a substrate;
an interlayer insulating film formed on said lower layer conductive film, said interlayer insulating film consisting of a multi-layer structure and includes an opening that reaches said lower layer conductive film;

a barrier insulating film formed to cover the only entire side wall of said opening in said interlayer insulating film, said barrier insulating film includes a material capable of preventing copper from being diffused;

an alloy film made of copper and a dissimilar element other than copper, said alloy film directly contacts said lower layer conductive film at the bottom surface of said opening and said alloy film is in contact with said barrier insulating film at the side wall of said opening in order to cover the inside wall of said opening; and an upper layer conductive film containing copper as a main component, said upper layer conductive film is formed on said alloy film in contact with said alloy film to fill the opening, wherein said barrier insulating film is a SiN film consisting of Si and N or a SiCN film.

2. The semiconductor device as set forth in claim 1, wherein said alloy film contains, as said dissimilar element, at least one element which is also contained in said barrier insulating film.

3. The semiconductor device as set forth in claim 1, wherein said barrier insulating film and said alloy film contain silicon.

4. The semiconductor device as set forth in claim 1, wherein said alloy film is a copper silicide layer.

5. The semiconductor device as set forth in claim 1, wherein said alloy film is made of an alloy of copper and at least one metal selected from among Hf, Ta, Ti, Nb and Zr.

6. The semiconductor device as set forth in claim 1, wherein said alloy film is formed to have a substantial uniform composition rate of said copper and said dissimilar element from the boundary with said upper layer conductive film to the boundary with said barrier insulating film.

7. The semiconductor device as set forth in claim 1, wherein said barrier insulating film is made of a material which contains substantially no oxygen.

8. A semiconductor device, comprising:

an interlayer insulating film formed on said lower layer conductive film, said interlayer insulating film consisting of a multi-layer structure and including an opening that reaches said lower layer conductive film;

a barrier insulating film formed covering the only entire side wall of said opening in said interlayer insulating film, said barrier insulating film including a material capable of preventing copper from being diffused;

an alloy film made of copper and a dissimilar element other than copper, said alloy film directly contacting said lower layer conductive film at the bottom surface of said opening and said alloy film in contact with said barrier insulating film at the side wall of said opening in order to cover the inside wall of said opening; and an upper layer conductive film containing copper as a main component, said upper layer conductive film formed on said alloy film in contact with said alloy film to fill the opening wherein said barrier insulating film is a SiN film consisting of Si and N or a SiCN film.

9. The semiconductor device as set forth in claim 8, wherein said alloy film contains, as said dissimilar element, at least one element which is also contained in said barrier insulating film.

10. The semiconductor device as set forth in claim 8, wherein said barrier insulating film and said alloy film contain silicon.

11. The semiconductor device as set forth in claim 8, wherein said alloy film is a copper silicide layer.

12. The semiconductor device as set forth in claim 8, wherein said alloy film is made of an alloy of copper and at least one metal selected from among Hf, Ta, Ti, Nb and Zr.

13. The semiconductor device as set forth in claim 8, wherein said alloy film is formed to have a substantial uniform composition rate of said copper and said dissimilar element from the boundary with said upper layer conductive film to the boundary with said barrier insulating film.

14. The semiconductor device as set forth in claim 8, wherein said barrier insulating film is made of a material which contains substantially no oxygen.

\* \* \* \* \*